United States Patent
Zhang et al.

(10) Patent No.: US 11,933,850 B2
(45) Date of Patent: Mar. 19, 2024

(54) DEVICE AND METHOD FOR DETECTING SLOT WEDGE, AIR GAP AND BROKEN ROTOR BAR IN MAGNETIC CIRCUIT OF ELECTRIC MACHINERY

(71) Applicant: HANGZHOU HENUOVA TECHNOLOGY CO., LTD., Hangzhou (CN)

(72) Inventors: Yuewu Zhang, Hangzhou (CN); Weixing Yang, Hangzhou (CN); Boyan Zhao, Hangzhou (CN); Jie Luo, Hangzhou (CN); Gang Du, Hangzhou (CN); Chao Wang, Hangzhou (CN); Han Gao, Hangzhou (CN); Liwei Qiu, Hangzhou (CN); Ming Xu, Hangzhou (CN); Jiamin Li, Hangzhou (CN); Yanxing Bao, Hangzhou (CN); Qianyi Zhang, Hangzhou (CN); Zuting Cao, Hangzhou (CN); Junliang Liu, Hangzhou (CN)

(73) Assignee: HANGZHOU HENUOVA TECHNOLOGY CO., LTD., Hangzhou (CN)

( * ) Notice: Subject to any disclaimer, the term of this patent is extended or adjusted under 35 U.S.C. 154(b) by 0 days.

(21) Appl. No.: 17/768,493

(22) PCT Filed: Aug. 2, 2021

(86) PCT No.: PCT/CN2021/110070
§ 371 (c)(1),
(2) Date: Apr. 13, 2022

(87) PCT Pub. No.: WO2022/037402
PCT Pub. Date: Feb. 24, 2022

(65) Prior Publication Data
US 2024/0044982 A1    Feb. 8, 2024

(30) Foreign Application Priority Data

Aug. 18, 2020 (CN) .......................... 202010829843.8

(51) Int. Cl.
*G01R 31/34* (2020.01)
(52) U.S. Cl.
CPC .................................. *G01R 31/34* (2013.01)
(58) Field of Classification Search
CPC ...... G01R 31/00; G01R 31/34; G01R 31/346; G01R 31/36; G01R 11/25; G01R 22/068; G01R 29/085
See application file for complete search history.

(56) References Cited

U.S. PATENT DOCUMENTS

| 4,377,784 A | 3/1983 | Saito et al. |
| 2003/0020485 A1* | 1/2003 | Matthews ............... G01R 31/34 324/545 |

(Continued)

FOREIGN PATENT DOCUMENTS

| AU | 2010362124 A1 | 3/2013 |
| CN | 107544025 A | 1/2018 |

(Continued)

*Primary Examiner* — Son T Le
(74) *Attorney, Agent, or Firm* — Bayramoglu Law Offices LLC

(57) ABSTRACT

A device for detecting a slot wedge, an air gap and a broken rotor bar is provided, where a sequential circuit generates double concurrent pulses; the sequential circuit is connected to driving power modules; the driving power modules are connected to front-end interface circuits; the front-end interface circuits convert the double concurrent pulses into corresponding magnetic-field pulses; the magnetic-field pulses are transmitted to power supply terminals on adjacent phases of stator windings through impedance matching pins and coupled at a corresponding coil, air gap and squirrel cage rotor to generate single groups of cyclic rotating (Continued)

magnetic potentials; single rotating magnetic potentials are sequentially generated in adjacent slots on each of the phases of the stator windings; rotating electric potentials in magnetic circuits with two symmetrical phases are magnetically coupled to form distributed coupling magnetic field reflected full-cycle waves for reflecting a difference of a corresponding slot wedge.

7 Claims, 5 Drawing Sheets

(56) References Cited

U.S. PATENT DOCUMENTS

| | | | |
|---|---|---|---|
| 2011/0304351 A1* | 12/2011 | Cop ...................... | G01R 31/34 324/765.01 |
| 2017/0219533 A1 | 8/2017 | Alford et al. | |
| 2021/0159842 A1* | 5/2021 | Nakamura ......... | G01R 31/3277 |

FOREIGN PATENT DOCUMENTS

| CN | 108872856 A | 11/2018 |
|---|---|---|
| CN | 110346685 A | 10/2019 |
| CN | 111521939 A | 8/2020 |
| CN | 111965541 A | 11/2020 |

* cited by examiner

DEVICE AND METHOD FOR DETECTING SLOT WEDGE, AIR GAP AND BROKEN ROTOR BAR IN MAGNETIC CIRCUIT OF ELECTRIC MACHINERY

CROSS REFERENCE TO THE RELATED APPLICATIONS

This application is the national stage entry of International Application No. PCT/CN2021/110070, filed on Aug. 2, 2021, which is based upon and claims priority to Chinese Patent Application No. 202010829843.8, filed on Aug. 18, 2020, the entire contents of which are incorporated herein by reference.

TECHNICAL FIELD

The present disclosure provides a device and method for detecting a slot wedge, an air gap and a broken rotor bar in a magnetic circuit of electric machinery, and belongs to the technical field of detection on electric rotating machinery.

BACKGROUND

Electric rotating machinery is one of main power devices in the modern electrical system, and the good operating state thereof contributes to ensuring and developing the whole system. Whether main devices in the electric rotating machinery have hidden troubles is directly associated with the stable and safe operation of the system. In addition to visual inspection, manual knocking on the slot wedges, and sound test through human ears or instruments, there haven't been effective methods in home and abroad to detect abnormalities of slot wedges and air gaps of the large electric rotating machinery. Broken bars of squirrel cage rotors are typically detected by acquiring current low and medium frequency components online for analysis. During overhauling, a turning gear is used to measure whether the terminal voltage jitters and the like. This method is merely used for fault detection without phasing and positioning, which cannot exactly determine defects of the whole magnetic circuits but only indicates a rough estimate of major faults. Moreover, when the major faults become severe, they explicitly and visually appear, but this method cannot accurately detect distributed states of the magnetic circuits in the full life cycle of the electric machinery. For symmetrical coupling magnetic fields in the magnetic circuits, there are no corresponding theories and detection methods.

SUMMARY

An objective of the present disclosure is to provide a device and method for detecting a slot wedge, an air gap and a broken rotor bar in a magnetic circuit of electric machinery to overcome the above defects. The present disclosure can determine states of whole magnetic circuits for the slot wedge, air gap and rotor in the electric rotating machinery, and is intuitive, simple, nondestructive and accurate without detachment.

To achieve the above-mentioned objective, the present disclosure provides a device for detecting a slot wedge, an air gap and a broken rotor bar in a magnetic circuit of electric machinery, where a sequential circuit generates double concurrent pulses; the sequential circuit is connected to driving power modules; the driving power modules are connected to front-end interface circuits; the front-end interface circuits convert the double concurrent pulses into corresponding magnetic-field pulses; the magnetic-field pulses are transmitted to power supply terminals on adjacent phases of stator windings through impedance matching pins, and coupled at a corresponding coil, air gap and squirrel cage rotor to generate single groups of cyclic rotating magnetic potentials; single rotating magnetic potentials are sequentially generated in adjacent slots on each of the phases of the stator windings; rotating electric potentials in magnetic circuits with two symmetrical phases are magnetically coupled to form distributed coupling magnetic field reflected full-cycle waves for reflecting a difference of a corresponding slot wedge; and a waveform acquisition unit acquires the coupling magnetic field reflected full-cycle waves for comparison.

Preferably, the double concurrent pulses may be symmetrical reverse synchronous pulses; the symmetrical reverse synchronous pulses may be formed into closed magnetic circuits in a coaxial ultrahigh-frequency magnetic core through single pulses; and the symmetrical reverse synchronous pulses may be generated in two coils through a transient magnetic coupling effect.

The present disclosure provides a method for detecting a slot wedge, an air gap and a broken rotor bar in a magnetic circuit of electric machinery, where magnetic-field pulses moving concurrently are reversely coupled and received by adjacent two-phase symmetrical windings of a stator to form distributed coupling magnetic field reflected full-cycle waves for reflecting a difference of a corresponding slot wedge; the waveform acquisition unit acquires adjacent two-phase coupling magnetic field reflected full-cycle waves of the stator to compare waveforms, and displays, in a form of a two-dimensional waveform, three time-domain projection surfaces formed into an angle of 120° in a circumferential direction; and waveforms of full-cycle waves of magnetic circuits reflect transient electromagnetic characteristics of the corresponding symmetrical magnetic circuits, and distributed states of the symmetrical magnetic circuits.

Specifically, the method may include the following steps:

(1) controlling, by a personal computer (PC) terminal, the sequential circuit to generate the double concurrent pulses that are the symmetrical reverse synchronous pulses;

(2) amplifying, by the driving power modules, the symmetrical reverse synchronous pulses and outputting the symmetrical reverse synchronous pulses to the front-end interface circuits, thereby converting into symmetrical reverse transient rotating magnetic-field pulses;

(3) transmitting the magnetic-field pulses to the power supply terminals on the adjacent phases of the stator windings through the impedance matching pins, the magnetic-field pulses being coupled at the corresponding coil, air gap and squirrel cage rotor to generate the single groups of cyclic rotating magnetic potentials;

(4) generating the single rotating magnetic potentials in the adjacent slots on each of the adjacent phases of the stator windings;

(5) magnetically coupling the rotating electric potentials in the magnetic circuits with the two symmetrical phases to form the distributed coupling magnetic field reflected full-cycle waves for reflecting the difference of the corresponding slot wedge; and (6) acquiring, by the waveform acquisition unit, the distributed coupling magnetic field reflected full-cycle waves, and comparing three waveforms of the electric machinery, where every two phases in the waveforms are formed into an angle of 120°.

Preferably, step (6) may specifically include: acquiring two two-phase distributed coupling magnetic field reflected full-cycle waves for a difference of a slot wedge and an air gap in a static working condition, where if differential waves coincide well, the slot wedge and the air gap are normal; and if a reversely deflecting negative wave appears on a major wave, the slot wedge and the air gap are abnormal and have hidden troubles.

Preferably, step (6) may specifically include: calibrating a position of the rotor, acquiring and recording a waveform for a first time, rotating the rotor by turning, acquiring and recording a waveform for a second time under same working parameters, comparing the two waveforms, and determining whether the squirrel cage rotor has a broken bar through a waveform change, where if the two waveforms are consistent and coincide well, the squirrel cage rotor is intact; and if the two waveforms are significantly different only at a special position, the squirrel cage rotor has a broken bar.

Preferably, when the symmetrical reverse transient rotating magnetic-field pulses are used to detect a slot wedge and an air gap of a three-phase stator, every two phases of a rotor have to be identical in a rotating direction, that is, the two phases are compared clockwise or counterclockwise.

The present disclosure performs the full-cycle detection on the electromagnetic circuits without the specific undetachable high-precision nondestructive detection method. On the basis of analyzing axi-symmetric characteristics of a rotating electromagnetic propagation field of the electric machinery, and using the technology of synchronously controlling the reverse pulses, increasing the differential amplification factor of the pulse current, and adjusting a rising edge of the pulse to match resonance parameters of the magnetic circuits, the present disclosure can display specific waveforms of distributed magnetic circuits for the slot wedge and air gap of the stator, and display the uniformly distributed coupling parameters of the slot wedge and air gap of the stator more clearly with the time-domain waveforms.

The present disclosure has the following beneficial effects:

The present disclosure can nondestructively detect the states of the slot wedge, air gap and rotor of large and medium-sized electric machinery online without detachment. On time-domain positions, the present disclosure can accurately determine the looseness of the slot wedge, abnormality of the air gap, and subtle changes in a forming stage, a developing stage and a fault stage of the broken rotor bar in the electric machinery, to provide important electrical test parameters for overhauling. In a static state and an angular turning state, the present disclosure can determine the states of the distributed magnetic circuits for the slot wedge, air gap and rotor in the electric machinery, and is intuitive, simple, nondestructive and accurate without detachment.

DETAILED DESCRIPTION OF THE EMBODIMENTS

Embodiment 1

Figure 1:
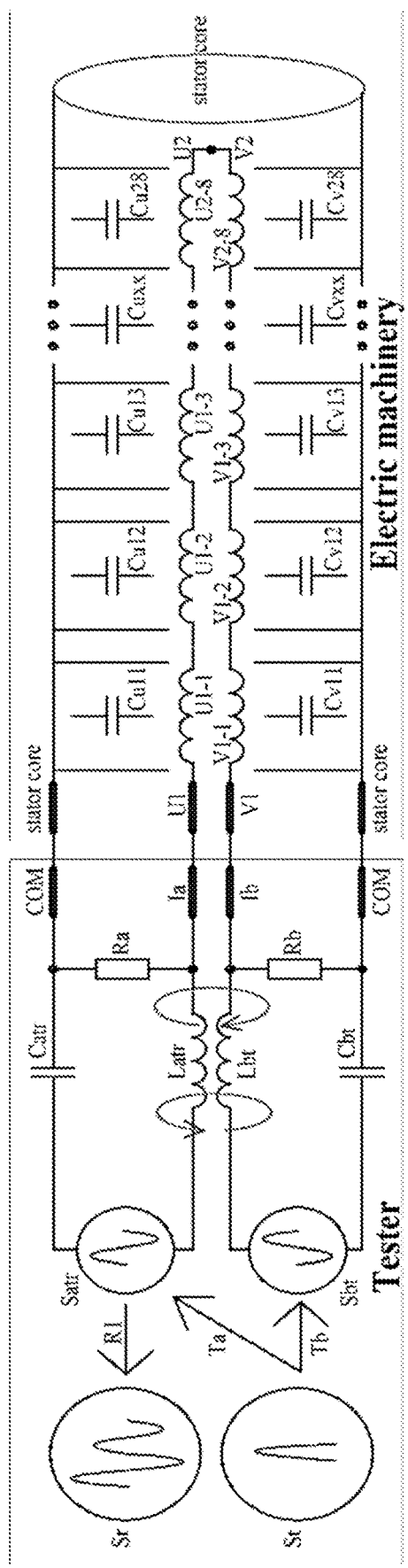
FIG. 1 schematically illustrates an electric field action in a differential comparison of a two-phase test.

As shown in FIG. 1, the present disclosure provides a device for detecting a slot wedge, an air gap and a broken rotor bar in a magnetic circuit of electric machinery, where a sequential circuit generates double concurrent pulses; the sequential circuit is connected to driving power modules; the driving power modules are connected to front-end interface circuits; the front-end interface circuits convert the double concurrent pulses into corresponding magnetic-field pulses; the magnetic-field pulses are transmitted to power supply terminals on adjacent phases of stator windings through impedance matching pins, and coupled at a corresponding coil, air gap and squirrel cage rotor to generate single groups of cyclic rotating magnetic potentials; single rotating magnetic potentials are sequentially generated in adjacent slots on each of the phases of the stator windings; rotating electric potentials in magnetic circuits with two symmetrical phases are magnetically coupled to form distributed coupling magnetic field reflected full-cycle waves for reflecting a difference of a corresponding slot wedge; and a waveform acquisition unit acquires the coupling magnetic field reflected full-cycle waves for comparison.

The double concurrent pulses are symmetrical reverse synchronous pulses; the symmetrical reverse synchronous pulses are formed into closed magnetic circuits in a coaxial ultrahigh-frequency magnetic core through single pulses; and the symmetrical reverse synchronous pulses are generated in two coils through a transient magnetic coupling effect.

Figure 3:
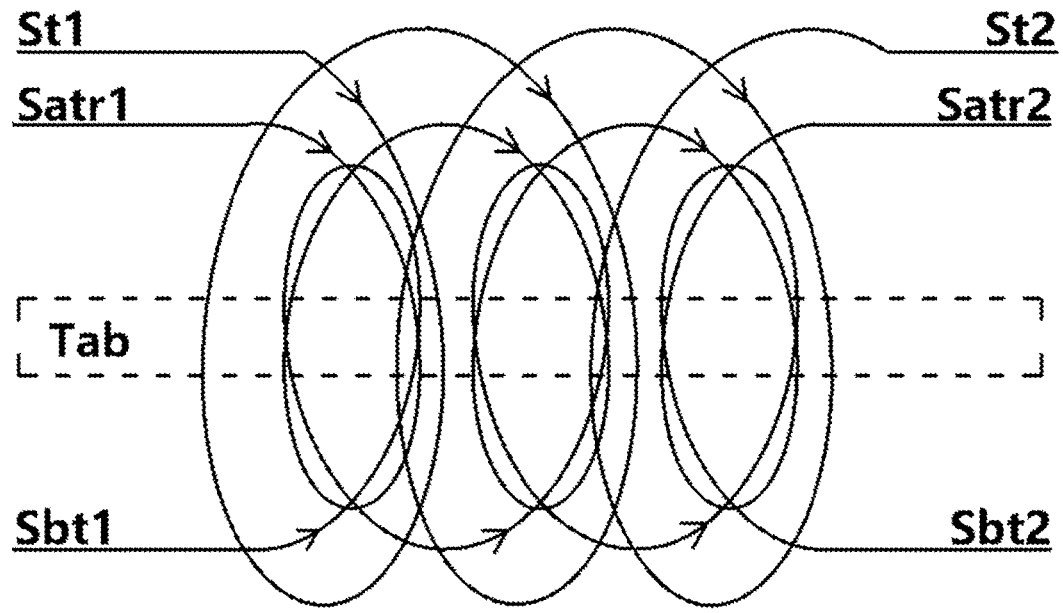
FIG. 3 schematically illustrates a magnetic circuit in which single pulses are converted into forward and backward synchronous pulses.
Figure 4:
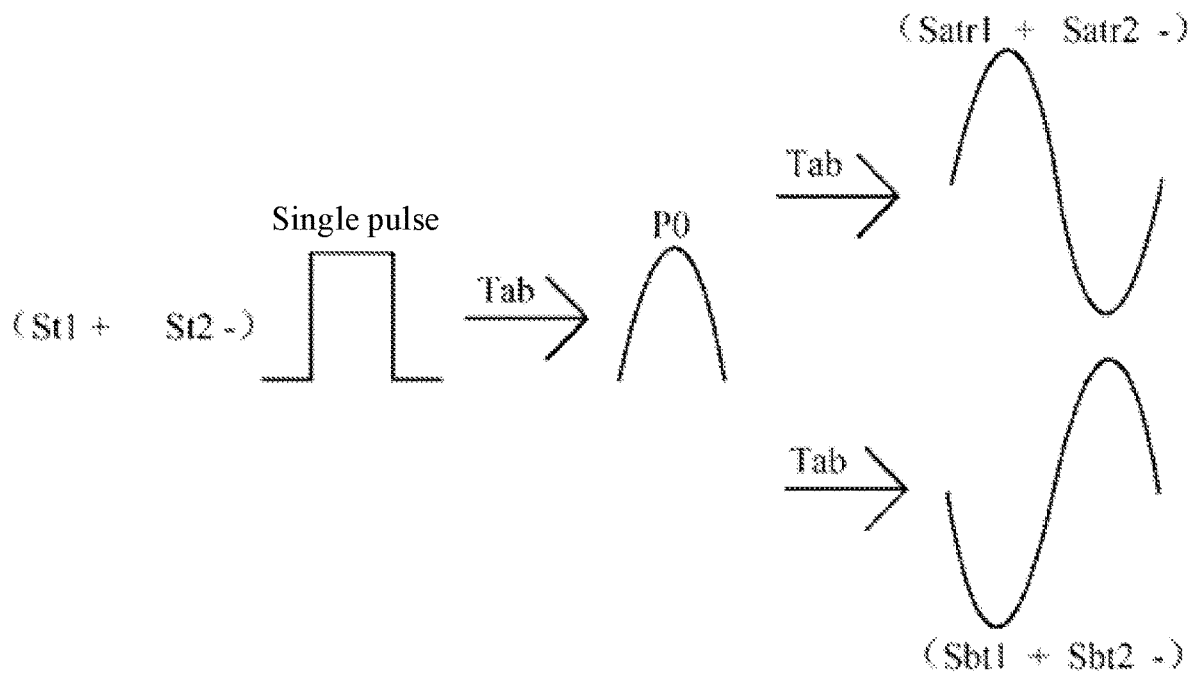
FIG. 4 schematically illustrates a logic for converting single pulses into forward and backward synchronous pulses.

Specifically, as shown in FIG. 3 and FIG. 4, single pulses are applied to St1 and St2, and formed into closed magnetic circuits through a coaxial Tab ultrahigh-frequency magnetic core. A P0 pulse is generated in the coil St. Through the transient magnetic coupling effect, the sinusoidal pulse with Satr1 as a positive pole is generated in the coil Satr, and the reverse synchronous sinusoidal pulse with Sbt1 as a negative pole is generated in the coil Sbt. The synchronization error between the pulse Satr and the pulse Sbt is less than 1 ns.

The present disclosure provides a method for detecting a slot wedge, an air gap and a broken rotor bar in a magnetic circuit of electric machinery, where magnetic-field pulses moving concurrently are reversely coupled and received by adjacent two-phase symmetrical windings of a stator to form distributed coupling magnetic field reflected full-cycle waves for reflecting a difference of a corresponding slot wedge; the waveform acquisition unit acquires adjacent two-phase coupling magnetic field reflected full-cycle waves of the stator to compare waveforms, and displays, in a form of a two-dimensional waveform, three time-domain projection surfaces formed into an angle of 120° in a circumferential direction; and waveforms of full-cycle waves of magnetic circuits reflect transient electromagnetic characteristics of the corresponding symmetrical magnetic circuits, and states of the symmetrical magnetic circuits.

Specifically, the method includes the following steps:

(1) A PC terminal controls the sequential circuit to generate the double concurrent pulses that are symmetrical reverse synchronous pulses.

(2) The driving power modules amplify the symmetrical reverse synchronous pulses, and output the symmetrical reverse synchronous pulses to the front-end interface circuits, thereby converting into symmetrical reverse transient rotating magnetic-field pulses.

(3) The magnetic-field pulses are transmitted to the power supply terminals on the adjacent phases of the stator windings through the impedance matching pins, the magnetic-field pulses being coupled at the corresponding coil, air gap and squirrel cage rotor to generate the single groups of cyclic rotating magnetic potentials.

(4) The single rotating magnetic potentials are generated in the adjacent slots on each of the adjacent phases of the stator windings.

(5) The rotating electric potentials in the magnetic circuits with the two symmetrical phases are magnetically coupled to form the distributed coupling magnetic field reflected full-cycle waves for reflecting the difference of the corresponding slot wedge.

(6) The waveform acquisition unit acquires the coupling magnetic field reflected full-cycle waves, and compares three waveforms of the electric machinery, where every two phases in the waveforms are formed into an angle of 120° in the circumferential direction.

Preferably, Step (6) specifically includes: two two-phase distributed coupling magnetic field reflected full-cycle waves for a difference of a slot wedge and an air gap are acquired in a static working condition, where if differential waves coincide well, the slot wedge and the air gap are normal; and if a reversely deflecting negative wave appears on a major wave, the slot wedge and the air gap are abnormal and have hidden troubles.

Preferably, Step (6) specifically includes: A position of the rotor is calibrated, a waveform is acquired and recorded for a first time, the rotor is rotated by turning, a waveform is acquired and recorded for a second time under same working parameters, the two waveforms are compared, and whether the squirrel cage rotor has a broken bar is determined through a waveform change, where if the two waveforms are consistent and coincide well, the squirrel cage rotor is intact; and if the two waveforms are significantly different only at a special position, the cage rotor has a broken bar.

When the symmetrical reverse transient rotating magnetic-field pulses are used to detect a slot wedge and an air gap of a three-phase stator, every two phases of a rotor have to be identical in a rotating direction, that is, the two phases are compared clockwise or counterclockwise.

Figure 2:
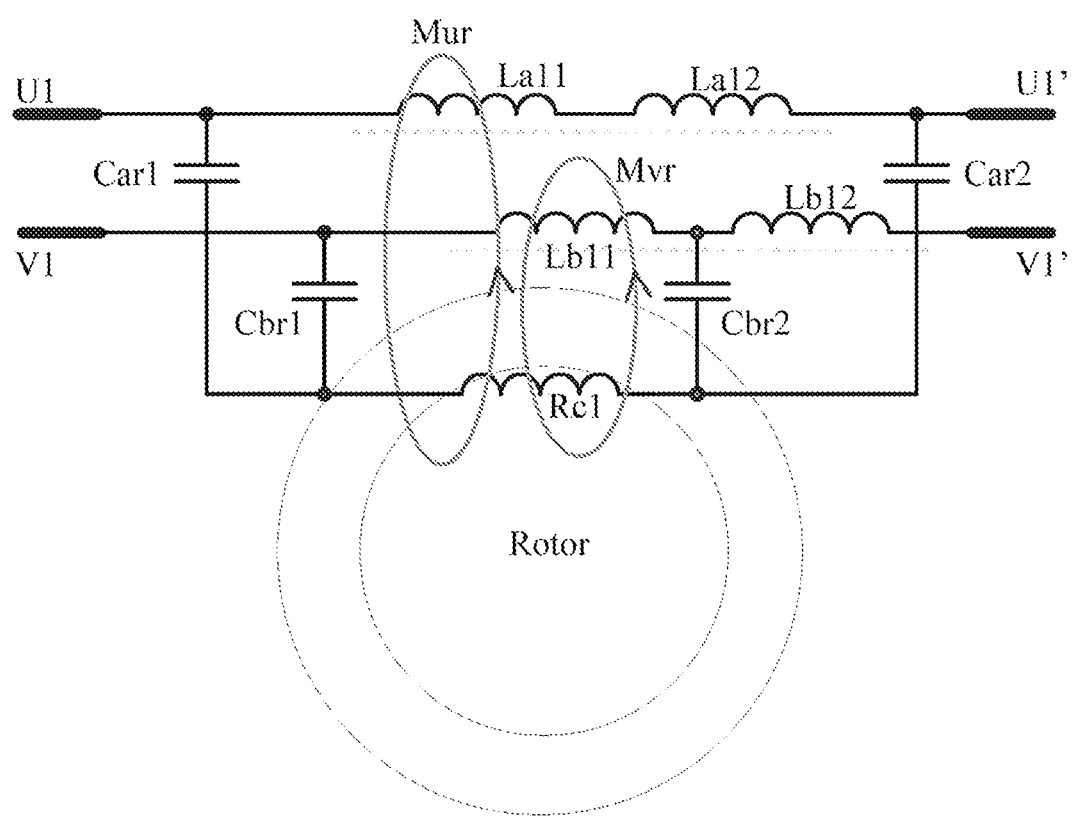
FIG. 2 schematically illustrates magnetic coupling for an air gap and a rotor in a single two-phase magnetic circuit.

Specifically, as shown in FIG. 1 and FIG. 2, the sequential circuit St in the left block diagram of FIG. 1 is provided with a pulse source to concurrently generate double pulses Satr and Sbt. The double pulses are respectively amplified by driving power modules Satr and Sbt, and output to channels a and b. Front-end interface circuits Latr and Lbt respectively convert voltage pulse sources into corresponding magnetic-field pulses. The magnetic-field pulses are transmitted through impedance matching interfaces Ra, Catr, Ia, Rb, Cbt, Ib and COM, and power supply terminals U1, V1 and stator core on adjacent phases of stator windings, and coupled at a corresponding coil, air gap and squirrel cage rotor to generate single groups of cyclic rotating magnetic potentials; and single rotating magnetic potentials are also generated sequentially in adjacent slots on each of the adjacent phase. As shown in FIG. 2, U1 is magnetically coupled through La11, La12, equivalent Car1 and Car2, and V1 is magnetically coupled through Lb11, Lb12, equivalent Cbr1 and Cbr2. Both U1 and V1 are respectively formed into a closed magnetic circuit with an equivalent inductor Rc1 of the rotor. In Mur and Mvr magnetic circuits with two symmetrical phases, rotating electric potentials are magnetically coupled to form magnetic coupling reflected full-cycle waves for reflecting the difference of the corresponding slot wedge. A receiving signal source is acquired through the interface, matching circuit and Satr. From R1 to the Sr collector, the output distributed reflected full-cycle waves are acquired by an operational amplifier and a high-speed data acquisition circuit. In view of the completely axi-symmetric electromagnetic characteristics with an included angle of 120° in the magnetic circuits, three test waveforms in which every two phases are formed into an angle of 120° are compared, thereby determining real distributed electromagnetic characteristics of corresponding slot wedges, air gaps and rotors in the symmetrical magnetic circuits clearly, simply and intuitively.

The present disclosure can perform the nondestructive full-cycle detection on the slot wedge, air gap and rotor of the large electric machinery intuitively, simply and conveniently without detachment, and can analyze the distributed magnetic circuits of the electric machinery on site, thereby providing important data for electrical test on the moving magnetic field of the electric machinery as well as scientific bases for delivery inspection of the electric machinery. The present disclosure is also convenient for managers and maintainers to quickly analyze the operating states and weak points of the distributed magnetic circuits of the electric machinery.

Embodiment 2

Figure 5:
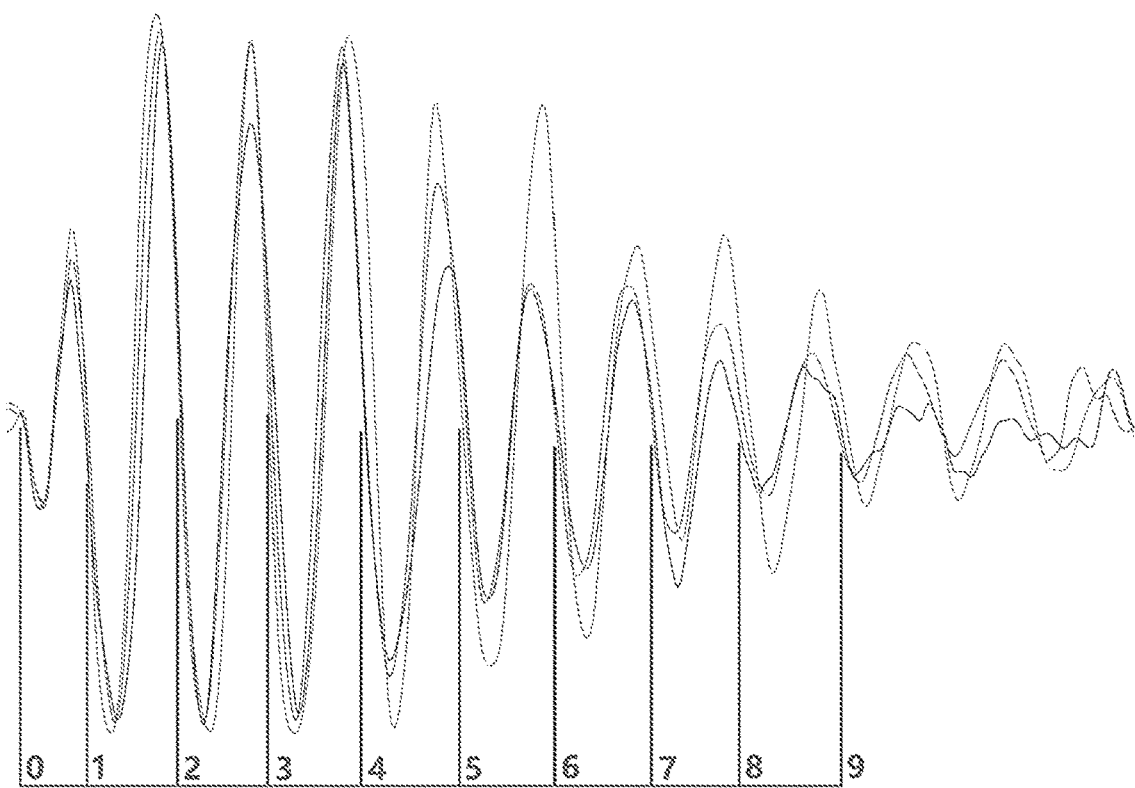
FIG. 5 illustrates a comparison between magnetic-field waveforms of UV, VW and WU two-phase coupling distributed magnetic circuits of a 225 KW starlike quadrupole asynchronous electric machinery according to Embodiment 2 of the present disclosure.

As shown in FIG. 5, the starlike quadrupole electric machinery using a 32-turn coil and a double-layer inserting process is tested. Three two-phase waveforms basically coincide in phase. 0-9 correspond to U, V and W power supply terminals to the tail end of the coil. Transient full-cycle differential waveforms of nine distributed coupling magnetic fields in the magnetic circuit are axi-symmetric, and the nine sinusoidal waves basically coincide in phase and amplitude variation, indicating that both the slot wedge and the air gap are normal.

Embodiment 3

Figure 6:
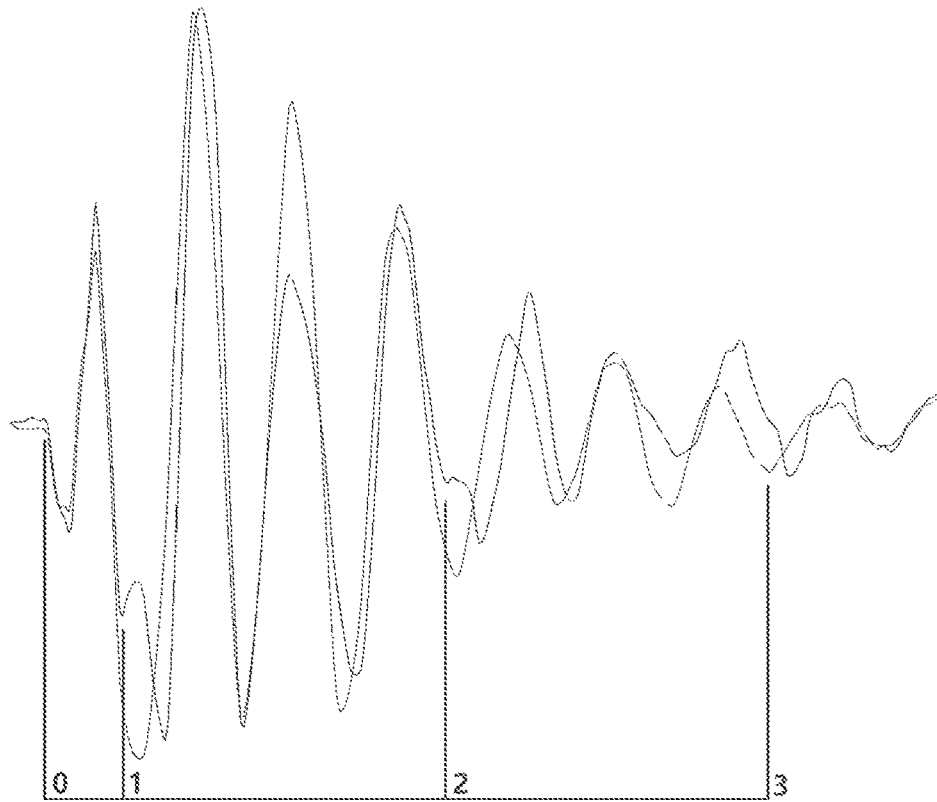
FIG. 6 illustrates a comparison between magnetic-field waveforms of UV and VW two-phase coupling distributed magnetic circuits of a 225 KW starlike quadrupole asynchronous electric machinery according to Embodiment 3 of the present disclosure.

As shown in FIG. 6, the starlike quadrupole electric machinery using a 32-turn coil and a double-layer inserting process is tested. For UV and VW two-phase waveforms, the second waveform shows the protrusion of the slot wedge at the first position to cause the abnormal air gap; and at the symmetrical second position, the reflected wave is attenuated for two times. For transient full-cycle differential characteristic waveforms of the nine coupling magnetic fields in the magnetic circuit, sinusoidal waves except the second and fifth groups basically coincide in phase and amplitude; and on the U phase, slot wedges at places corresponding to fifth to eighth coils are protruded to affect the air gaps, and others are normal.

Embodiment 4

Figure 7:
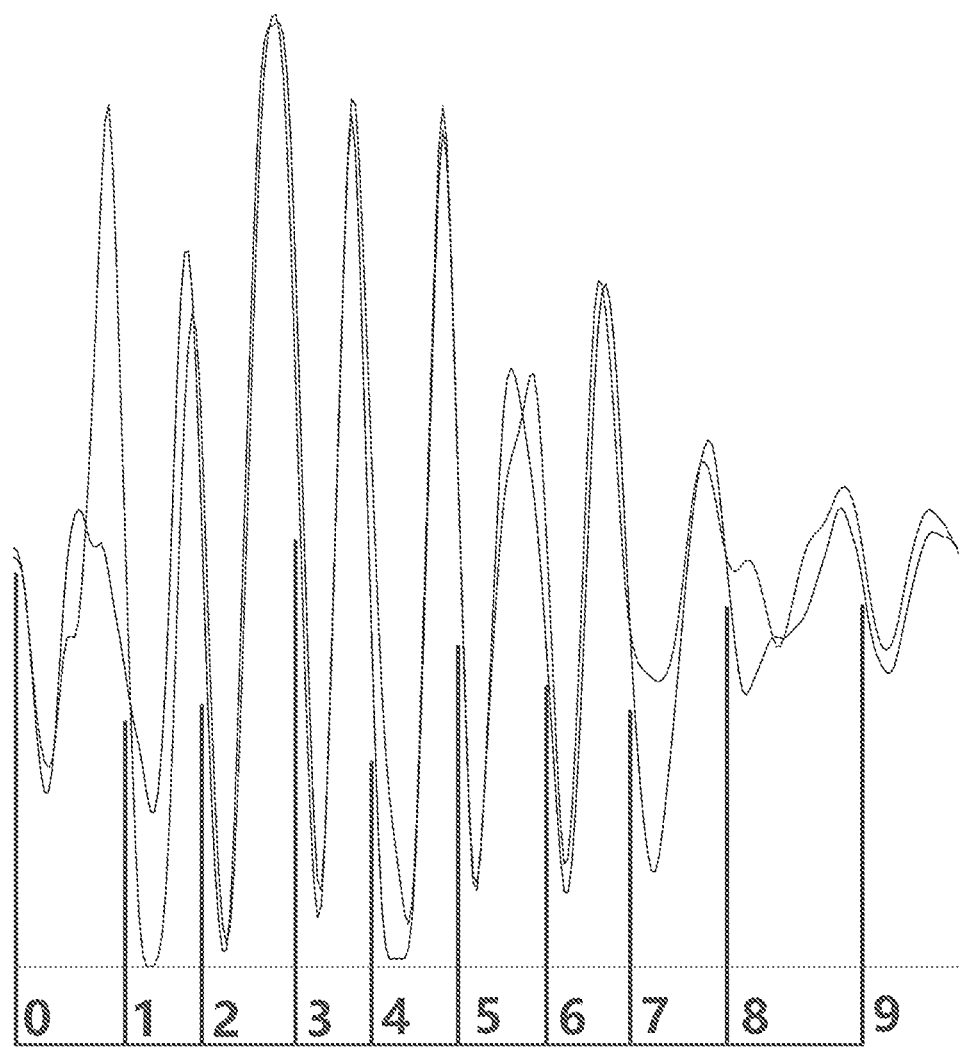
FIG. 7 illustrates a comparison between magnetic-field waveforms of VW two-phase coupling distributed magnetic circuits of a 250 KW starlike quadrupole asynchronous electric machinery at and 120° according to Embodiment 4 of the present disclosure.

As shown in FIG. 7, the starlike quadrupole electric machinery using a 32-turn coil and a double-layer inserting process is tested. For the VW two-phase waveform, there is a large deviation for 0° and 120° on the waveform of the magnetic circuit at 0-1 positions; and at the symmetrical 7-8 positions, there are two reflected waves. For transient full-cycle differential characteristic waveforms of the nine coupling magnetic fields in the magnetic circuit, sinusoidal waves except 0 and 8 groups basically coincide in phase and amplitude; and rotor bars in 0 and 8 groups are broken, and those in other groups are normal.

What is claimed is:

1. A device for detecting a slot wedge, an air gap and a broken rotor bar in a magnetic circuit of electric machinery, comprising a sequential circuit configured to generate double concurrent pulses;

driving power modules connected to the sequential circuit;

front-end interface circuits, wherein the driving power modules are connected to the front-end interface circuits, the front-end interface circuits are configured to convert the double concurrent pulses into corresponding magnetic-field pulses, the magnetic-field pulses are transmitted to power supply terminals on adjacent phases of stator windings through impedance matching pins, and coupled at a corresponding coil, air gap and squirrel cage rotor to generate single groups of cyclic rotating magnetic potentials, single rotating magnetic potentials are sequentially generated in adjacent slots on each of the phases of the stator windings, rotating electric potentials in magnetic circuits with two symmetrical phases are magnetically coupled to form distributed coupling magnetic field reflected full-cycle waves for reflecting a difference of a corresponding slot wedge;

a waveform acquisition unit configured to acquire the distributed coupling magnetic field reflected full-cycle waves for comparison; and the double concurrent pulses are symmetrical reverse synchronous pulses; the symmetrical reverse synchronous pulses are formed into closed magnetic circuits in a coaxial ultrahigh-frequency magnetic core through single pulses; and the symmetrical reverse synchronous pulses are generated in two coils through a transient magnetic coupling effect.

2. A method for detecting a slot wedge, an air gap and a broken rotor bar in a magnetic circuit of electric machinery according to claim 1, comprising forming the distributed coupling magnetic field reflected full-cycle waves for reflecting the difference of the corresponding slot wedge after magnetic-field pulses concurrently moving are reversely coupled and received by adjacent two-phase symmetrical windings of a stator;

acquiring, by the waveform acquisition unit, adjacent two-phase coupling magnetic field reflected full-cycle waves of the stator to compare waveforms; and displaying, in a form of a two-dimensional waveform, three time-domain projection surfaces formed into an angle of 120° in a circumferential direction, wherein waveforms of full-cycle waves of magnetic circuits reflect transient electromagnetic characteristics of a corresponding symmetrical magnetic circuits, and states of the symmetrical magnetic circuits.

3. The method for detecting a slot wedge, an air gap and a broken rotor bar in a magnetic circuit of electric machinery according to claim 2, specifically comprising the following steps:

(1) controlling, by a personal computer (PC) terminal, the sequential circuit to generate the double concurrent pulses that are symmetrical reverse synchronous pulses;

(2) amplifying, by the driving power modules, the symmetrical reverse synchronous pulses and outputting the symmetrical reverse synchronous pulses to the front-end interface circuits, thereby converting into symmetrical reverse transient rotating magnetic-field pulses;

(3) transmitting the magnetic-field pulses to the power supply terminals on the adjacent phases of the stator windings through the impedance matching pins, coupling the magnetic-field pulses at the corresponding coil, air gap and squirrel cage rotor to generate the single groups of cyclic rotating magnetic potentials;

(4) generating the single rotating magnetic potentials in the adjacent slots on each of the adjacent phases of the stator windings;

(5) magnetically coupling the rotating electric potentials in the magnetic circuits with the two symmetrical phases to form the distributed coupling magnetic field reflected full-cycle waves for reflecting the difference of the corresponding slot wedge; and (6) acquiring, by the waveform acquisition unit, the coupling magnetic field reflected full-cycle waves, and comparing three waveforms of the electric machinery, wherein every two phases in the waveforms are formed into an angle of 120°.

4. The method for detecting a slot wedge, an air gap and a broken rotor bar in a magnetic circuit of electric machinery according to claim 3, wherein step (6) specifically comprises:

acquiring two two-phase distributed coupling magnetic field reflected full-cycle waves for a difference of a slot wedge and an air gap in a static working condition, wherein if differential waves coincide well, determining that the slot wedge and the air gap are normal; and if a reversely deflecting negative wave appears on a major wave, determining that the slot wedge and the air gap are abnormal and have hidden troubles.

5. The method for detecting a slot wedge, an air gap and a broken rotor bar in a magnetic circuit of electric machinery according to claim 3, wherein step (6) specifically comprises:

calibrating a position of the rotor, acquiring and recording a waveform for a first time, rotating the rotor by turning, and acquiring and recording a waveform for a second time under same working parameters, comparing the two waveforms, and determining whether a squirrel cage rotor has a broken bar through a waveform change, wherein if the two waveforms are consistent and coincide well, determining that the squirrel cage rotor is intact; and if the two waveforms are significantly different only at a special position, determining that the squirrel cage rotor has a broken bar.

6. The method for detecting a slot wedge, an air gap and a broken rotor bar in a magnetic circuit of electric machinery according to claim 3, wherein when the symmetrical reverse transient rotating magnetic-field pulses are used to detect a slot wedge and an air gap of a three-phase stator, every two phases of a rotor have to be identical in a rotating direction, that is, the two phases are compared clockwise or counter-clockwise.

7. The method for detecting a slot wedge, an air gap and a broken rotor bar in a magnetic circuit of electric machinery according to claim 4, wherein when the symmetrical reverse transient rotating magnetic-field pulses are used to detect a slot wedge and an air gap of a three-phase stator, every two phases of a rotor have to be identical in a rotating direction, that is, the two phases are compared clockwise or counter-clockwise.

* * * * *